United States Patent

Binnard

(10) Patent No.: US 6,678,038 B2
(45) Date of Patent: Jan. 13, 2004

(54) APPARATUS AND METHODS FOR DETECTING TOOL-INDUCED SHIFT IN MICROLITHOGRAPHY APPARATUS

(75) Inventor: Michael Binnard, Belmont, CA (US)

(73) Assignee: Nikon Corporation, Tokyo (JP)

( * ) Notice: Subject to any disclaimer, the term of this patent is extended or adjusted under 35 U.S.C. 154(b) by 51 days.

(21) Appl. No.: 09/922,522

(22) Filed: Aug. 3, 2001

(65) Prior Publication Data
US 2003/0025895 A1 Feb. 6, 2003

(51) Int. Cl.$^7$ ................. G03B 27/58; G03B 27/42; G01B 11/00
(52) U.S. Cl. ................. 355/72; 355/53; 356/399
(58) Field of Search ................. 355/72, 53, 77; 356/399, 400, 401; 430/22

(56) References Cited

U.S. PATENT DOCUMENTS

| 5,243,195 A | 9/1993 | Nishi |
| 5,493,403 A | 2/1996 | Nishi |
| 5,504,407 A | 4/1996 | Wakui et al. |
| 5,528,118 A | 6/1996 | Lee |
| 5,623,853 A | 4/1997 | Novak et al. |
| 5,668,672 A | 9/1997 | Oomura |
| 5,677,758 A | 10/1997 | McEachern et al. |
| 5,689,377 A | 11/1997 | Takahashi |
| 5,715,064 A | 2/1998 | Lin |
| 5,835,275 A | 11/1998 | Takahashi et al. |
| 5,874,820 A | 2/1999 | Lee |
| 6,020,964 A | 2/2000 | Loopstra et al. |
| 6,208,407 B1 | 3/2001 | Loopstra |
| 6,400,441 B1 | 6/2002 | Nishi et al. |
| 6,400,445 B2 * | 6/2002 | Nishi et al. ............ 355/72 |
| 2002/0037460 A1 * | 3/2002 | Takahashi ............ 430/22 |

* cited by examiner

Primary Examiner—Russell Adams
Assistant Examiner—Peter B. Kim
(74) Attorney, Agent, or Firm—Klarquist Sparkman, LLP

(57) ABSTRACT

Apparatus and methods are disclosed for detecting and measuring a tool-induced shift in a microlithography apparatus ("stepper"). The apparatus and methods are set forth in the context of microlithography apparatus that include a wafer stage and a holding member to which the wafer is mounted for exposure. The holding member can include, for example, a wafer table and wafer chuck, wherein the wafer table desirably includes a respective movable mirror for each of X- and Y-directions of movement. The holding member is rotatable, relative to the wafer stage, from a first rotational position to a second rotational position, which can be angularly displaced, e.g., 90° and/or 180° from each other. At each of the first and second rotational positions, a respective location of an alignment feature on the holding member (e.g., on the substrate, wafer chuck, or wafer table) is determined. The respective locations at the first and second rotational positions are compared, and a corresponding tool-induced shift is determined from a detected difference between the respective locations. Rotation of the holding member desirably is effected using a rotary actuator.

38 Claims, 8 Drawing Sheets

FIG. 8(A)
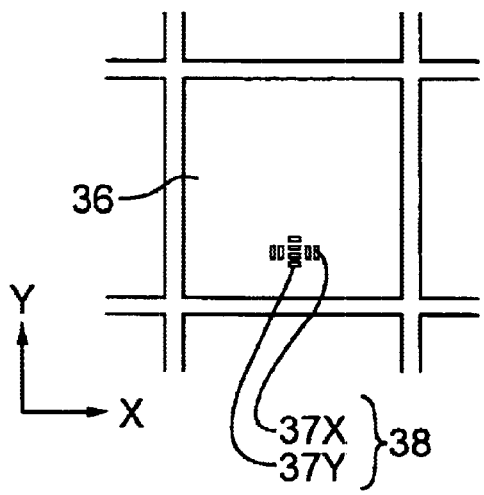
FIG. 8(B)
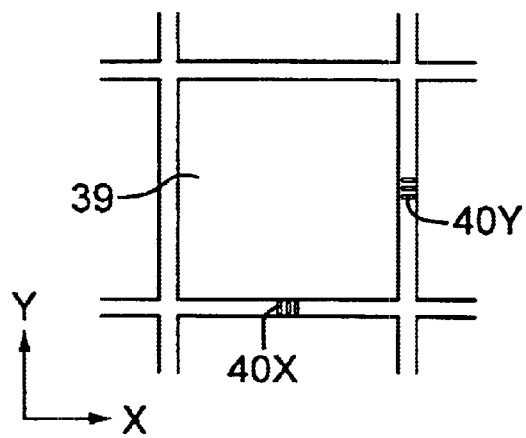
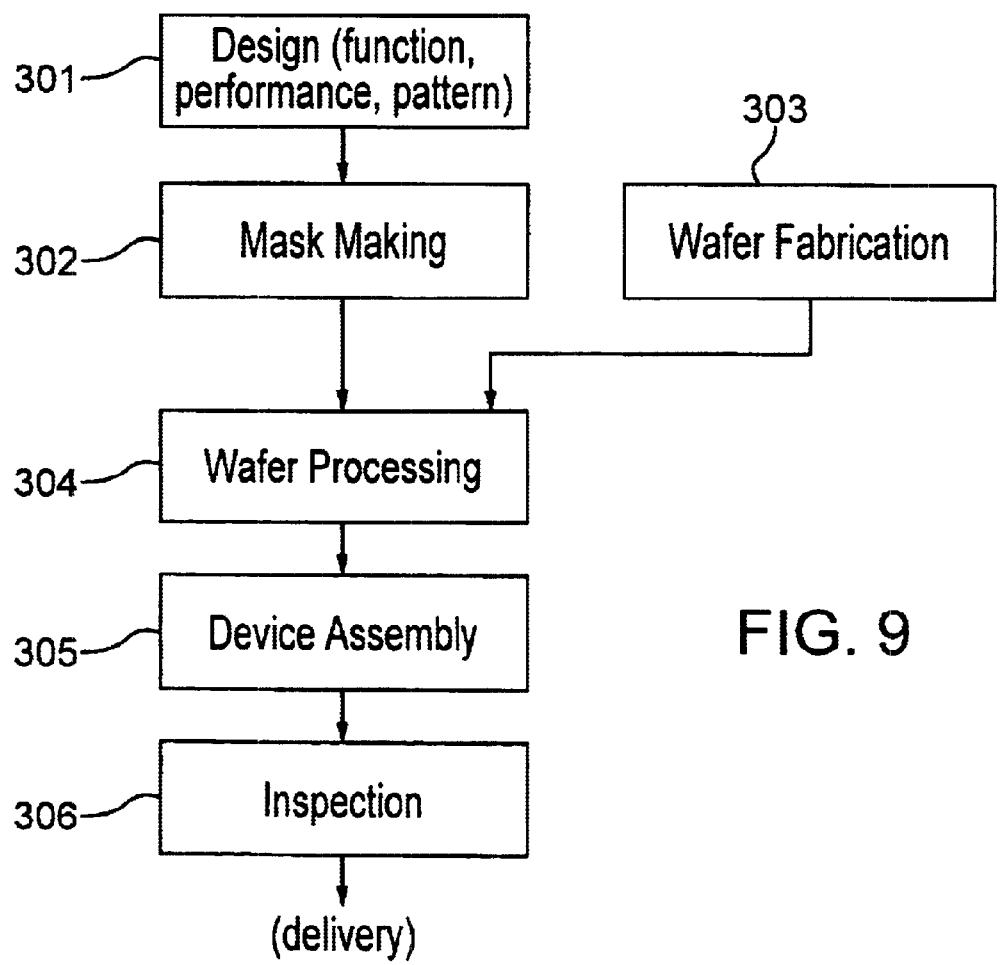
FIG. 9

APPARATUS AND METHODS FOR DETECTING TOOL-INDUCED SHIFT IN MICROLITHOGRAPHY APPARATUS

FIELD OF THE INVENTION

This invention pertains, inter alia, to microlithography, which involves the transfer of a pattern, usually defined by a reticle or mask, onto a "sensitive" substrate using an energy beam. Microlithography is a key technology used in the manufacture of microelectronic devices such as integrated circuits, displays, thin-film magnetic pickup heads, and micromachines. More specifically, the invention pertains to methods and devices, used in the context of a microlithography method and apparatus, respectively, for rotating a substrate as required for assessing undesired measurement error of the substrate position.

BACKGROUND OF THE INVENTION

As the density and miniaturization of microelectronic devices have continued to increase, the accuracy and resolution demands imposed on microlithographic methods also have increased. Currently, most microlithography is performed using, as an energy beam, a light beam (typically deep-UV light) produced by a high-pressure mercury lamp or excimer laser, for example. These microlithography apparatus are termed "optical" microlithography apparatus. Emerging microlithographic technologies include charged-particle-beam ("CPB"; e.g., electron-beam) microlithography and "soft-X-ray" (or "extreme UV") microlithography. Because many contemporary microlithography machines operate according to the well-known "step-and-repeat" exposure scheme, they are often referred to generally as "steppers."

All microlithographic technologies involve pattern transfer to a suitable substrate, which can be, for example, a semiconductor wafer (e.g., silicon wafer), glass plate, or the like. So as to be imprintable with the pattern, the substrate typically is coated with a "resist" that is sensitive to exposure, in an image-forming way, by the energy beam in a manner analogous to a photographic exposure. Hence, a substrate prepared for microlithographic exposure is termed a "sensitive" substrate.

For microlithographic exposure, the substrate (also termed herein a "wafer") typically is mounted on a substrate stage (also called a "wafer stage"). The wafer stage is a complex and usually quite massive device that not only holds the wafer for exposure (with the resist facing in the upstream direction) but also provides for controlled movement of the wafer in the X- and Y-directions (and sometimes the Z-direction) as required for exposure and for alignment purposes. In most microlithography apparatus, a number of devices are mounted to and supported by the wafer stage. These devices include a "wafer table" and a "wafer chuck" attached to the wafer table. The wafer table can be used to perform fine positional adjustment of the wafer relative to the wafer stage, and often is configured to perform limited tilting of the wafer chuck (holding the wafer) relative to the Z-axis (e.g., optical axis).

The wafer chuck is configured to hold the wafer firmly for exposure and to facilitate presenting a planar sensitive surface of the wafer for exposure. The wafer usually is held to the surface of the wafer chuck by vacuum, although other techniques such as electrostatic attraction also are employed under certain conditions. The wafer chuck also facilitates the conduction of heat away from the wafer that otherwise may accumulate in the wafer during exposure.

Monitoring of the position of the wafer in the X-, Y-, and Z-directions must be performed with extremely high accuracy to ensure the attainment of the desired accuracy of exposure of the pattern from the reticle to the wafer. The key technology employed for such purposes is interferometry, due to the extremely high accuracy obtainable with this technology. Interferometry usually involves the reflection of light from mirrors, typically located on the wafer table, and the generation of interference fringes that are detected. Changes in the pattern of interference fringes are detected and interpreted as corresponding changes in position of the wafer table (and thus the wafer). To facilitate measurements in both the X- and Y-directions over respective ranges sufficiently broad to encompass the entire wafer, the wafer table typically has mounted thereto an X-direction movable mirror and a Y-direction movable mirror. The X-direction movable mirror usually extends in the Y-direction along a full respective side of the wafer table, and the Y-direction movable mirror usually extends in the X-direction along a full respective side of the wafer table.

Despite the extremely high accuracy with which modern microlithography apparatus are constructed and with which positional measurements can be performed in these apparatus, the measurements still are not perfect and hence are characterized by certain tolerances. With respect to these tolerances, a measurement error caused by the apparatus itself is termed a "tool-induced shift," or "TIS," an error attributed to variations in the wafers (or other substrates) is termed a "wafer-induced shift," or "WIS." The term "tool" is derived from the common reference to a microlithography apparatus as a "lithography tool."

Whenever a wafer is mounted on the wafer chuck, the microlithography apparatus normally executes an alignment routine to determine the precise position and orientation of the wafer before initiating exposure of the wafer. To such end, the wafer chuck typically includes "fiducial" (reference) marks strategically placed around the wafer. Similarly, the wafer itself typically includes multiple alignment marks imprinted thereon.

Reference now is made to FIG. 6, depicting a schematic plan view of a conventional stepper machine S in the region of the wafer stage WS. The wafer stage WS includes a wafer table WT and a wafer chuck WC. The wafer table WT includes an X-direction movable mirror $M_X$ and a Y-direction movable mirror My. In the stepper S, the wafer stage WS is movable (to the left and right in the figure) to assume either of two positions, an alignment position $P_A$ and an exposure position $P_E$. At the alignment position $P_A$, the wafer table WT is positioned relative to an alignment axis $A_A$ extending in the Z-axis direction in the figure. At the exposure position $P_E$, the wafer table WT is positioned relative to an exposure axis $A_E$, also extending in the Z-axis direction parallel to the alignment axis $A_A$. The alignment axis $A_A$ is coincident with the optical axis of an alignment microscope (not shown, but situated above the plane of the page of the figure). The exposure axis $A_E$ is coincident with the optical axis of a projection-optical system (not shown but situated above the plane of the page of the figure).

Whenever the wafer stage WS is in a loading position near the alignment position $P_A$, a wafer W can be conveyed (usually robotically) into the stepper S and placed on the wafer chuck WC on the wafer table WT. Subsequently, the wafer stage WS moves to the alignment position $P_A$, at which the alignment microscope is used to align the wafer W on the wafer chuck WC and perform other pre-exposure alignments of the wafer as required. (To such end, the wafer W can include alignment marks M, discussed below.) Upon completion of measurements and alignments performed at the alignment position $P_A$, the wafer stage WS moves (note arrow AR) the wafer table WT (with wafer chuck WC and wafer W) to the exposure position $P_E$. At the exposure position $P_E$, further measurements and alignments of the wafer table WT usually are performed. Also, if conditions are appropriate, the wafer W is exposed with a pattern defined by a reticle (not shown but situated on the exposure axis $A_E$ above the plane of the figure).

As alignments of the wafer W are being performed with the wafer stage WS at the alignment position $P_A$, the respective positions of the wafer table WT in the X-direction and the Y-direction are monitored and determined by respective interferometers $IF_{XL}$, $IF_{YA}$ that direct respective laser light beams at the respective movable mirrors $M_X$, $M_Y$. Similarly, whenever the wafer stage WS is at the exposure position $P_E$, the respective positions of the wafer table WT in the X-direction and the Y-direction are monitored and determined by respective interferometers $IF_{XL}$ and $IF_{YP}$. Note that the X-direction interferometer $IF_{XL}$ is used to monitor position of the wafer table WT in both the alignment position $P_A$ and the exposure position $P_E$.

The interferometers $IF_{XL}$, $IF_{YP}$, $IF_{YA}$ are connected to a controller (also termed a "processor" or "computer") C. As is well known, the controller C is configured to receive data from the interferometers and to perform arithmetical calculations by which data from the interferometers are converted to data concerning the X-Y position of the wafer table WT. Typically, the controller C also is connected to any of various other data-producing and data-responsive components of the stepper machine S, and thus serves to coordinate and execute overall operation of the stepper machine S.

Normally, the optical axis $A_A$ of the alignment microscope is oriented extremely accurately parallel to the optical axis $A_E$ of the projection-optical system of the stepper S. This ensures that an accurate measurement of the wafer W by the alignment microscope results in the wafer W being sufficiently accurately positioned and aligned for actual microlithographic exposure. However, because of variations in the photoresist or wafer topology, certain errors can become manifest in the alignment or mark-position results obtained using the alignment microscope. As a result, for example, the apparent position of an alignment mark M as determined by the alignment microscope is actually displaced from the actual ("real") position of the mark M. This displacement is an example of the TIS to which the present invention is directed.

SUMMARY OF THE INVENTION

In view of the shortcomings of conventional apparatus as summarized above, a first aspect of the invention is set forth in the context of microlithography methods performed using a microlithography apparatus including a wafer stage and a "holding member," and provides methods for measuring a tool-induced shift. As used herein, a "holding member" is any suitable member configured to hold a substrate relative to the wafer stage. For example, the holding member can include a wafer table and a wafer chuck to which the substrate is mounted.

In a first embodiment of a method according to the invention, the holding member is provided with rotatability, relative to the wafer stage, from a first rotational position to a second rotational position. At the first rotational position, a respective location of an alignment feature on the holding member is determined. The holding member then is rotated about a rotational axis to the second rotational position. At the second rotational position, a respective location of the alignment feature is determined. The respective location of the alignment feature determined at the first rotational position is compared with the respective location of the alignment feature at the second rotational position. A corresponding tool-induced shift is determined from a detected difference between the respective locations.

As noted above, the alignment feature (e.g., an alignment mark) is located "on" the holding member. As this expression is used herein, the alignment feature can be located, for example, on the substrate (e.g., semiconductor wafer) or on a wafer chuck to which the substrate is mounted. Further alternatively, in some embodiments, the alignment feature can be located on the wafer table if the holding member includes a wafer table, wherein a wafer chuck is mounted to the wafer table.

For rotatability of the holding member, a rotary actuator is provided that is situated and configured to rotate the holding member relative to the wafer stage about the rotational axis from the first rotational position to the second rotational position. The rotary actuator can be any of various suitable devices for imparting a controlled rotation of the holding member, about the rotational axis, over a defined angular displacement, such as 90° and/or 180°, relative to the wafer stage. At each of the first and second rotational positions, the alignment feature can be imaged, to facilitate alignment of the alignment feature with the alignment reference, using a microscope. Meanwhile, coordinates of the alignment feature are determined. Typically, the coordinates are in an X-Y plane perpendicular to an optical axis of an imaging system.

The wafer stage can be movable back and forth between an alignment position and an exposure position. In such an instance, the respective determinations of the respective locations of the alignment feature can be made at the alignment position or at both the alignment position and the exposure position.

In another embodiment of a method according to the invention for measuring tool-induced shift, the wafer table includes a wafer chuck to which a substrate is mounted. A rotary actuator is provided that is situated and configured to rotate the wafer table and wafer chuck relative to the wafer stage about a rotational axis from a first rotational position to a second rotational position. An alignment feature is provided on at least one of the wafer table, wafer chuck, and substrate. At the first rotational position, the alignment feature is aligned with an alignment reference, and a respective positional coordinate of the wafer table is determined. At the second rotational position, the alignment feature is aligned with the alignment reference, and a respective positional coordinate of the wafer table is determined. The respective coordinate determined at the first rotational position is compared with the respective coordinate determined at the second rotational position, and a corresponding tool-induced shift is determined from a detected difference between the respective coordinates.

As noted above, the first and second rotational positions can be, for example, 90° and/or 180° relative to each other. At each rotational position, the respective alignments desirably are performed using a microscope, and the respective positional coordinates desirably are determined using respective interferometers, which can be the same interferometers or one or more different interferometers as required at each rotational position.

The wafer stage can be movable back and forth between an alignment position and an exposure position. At the alignment position or at both the alignment position and the exposure position, an interferometer(s) produces data on the positional coordinates of the holding member.

Another aspect of the invention, set forth in the context of microlithography apparatus that include a wafer table and a wafer stage, provides devices for measuring a tool-induced shift. An embodiment of such a device comprises a rotary actuator that is situated and configured to rotate the wafer table relative to the wafer stage from a first rotational position to a second rotational position. The device also includes an alignment-measurement device situated and configured to align an alignment feature, carried by the wafer table, with an alignment reference. At least one respective interferometer is provided for the first and second rotational positions. The respective interferometers are situated and configured to obtain data on positional coordinates of the wafer table at the first and second rotational positions as the alignment feature is aligned with the alignment reference. A controller is connected to the rotary actuator and the interferometers. The controller is configured to determine a tool-induced shift from the positional coordinates at each of the first and second rotational positions of the wafer table.

As noted above, the rotary actuator can be configured to rotate the wafer table 90° and/or 180° relative to the wafer stage from the first rotational position to the second rotational position. Also, the wafer stage can be movable back and forth between an alignment position and an exposure position.

Also as noted above, the alignment-measurement device desirably comprises an alignment microscope, and the wafer table desirably includes a wafer chuck mounted to the wafer table. The wafer table desirably comprises an X-direction movable mirror and a Y-direction movable mirror, wherein the apparatus further comprises one or more respective interferometers for each of the X-direction movable mirror and Y-direction movable mirror at each of the first and second rotational positions. The number of movable mirrors is not limited to one in each of the X- and Y-directions. Multiple movable mirrors in either or both directions can be employed, which can reduce the number of interferometers required.

In another embodiment of a device according to the invention, a rotary actuator is situated and configured to rotate the wafer table relative to the wafer stage about a rotational axis from a first rotational position to a second rotational position. An alignment microscope is situated and configured to align an alignment feature, carried by the wafer table, with an alignment reference. At least one respective interferometer is situated and configured to obtain data on positional coordinates of the wafer table at each of the first and second rotational positions as the alignment feature is aligned with the alignment reference. The device also includes a controller, connected to the rotary actuator and the interferometers, that is configured to determine a tool-induced shift from the positional coordinates at each of the first and second rotational positions of the wafer table. A wafer chuck desirably is mounted to the wafer table, in which instance the alignment feature can comprise an alignment mark located on at least one of the wafer table, wafer chuck, and substrate held by the wafer chuck. The wafer table comprises at least two movable mirrors including an X-direction movable mirror and a Y-direction movable mirror, and a respective interferometer is provided for each of the movable mirrors at each of the first and second rotational positions.

The foregoing and additional features and advantages of the invention will be more readily apparent from the following detailed description, which proceeds with reference to the accompanying drawings.

BRIEF DESCRIPTION OF THE DRAWINGS

FIGS. 8(A)–8(B) are respective plan views of exemplary alignment marks on the wafer, as described in the fourth representative embodiment.

FIG. 9 is a flow chart of certain steps in an exemplary process for manufacturing a microelectronic device, as described in the fifth representative embodiment.

DETAILED DESCRIPTION

This invention is described in the context of several representative embodiments that are not intended to be limiting in any way.

General Considerations

Figure 1:
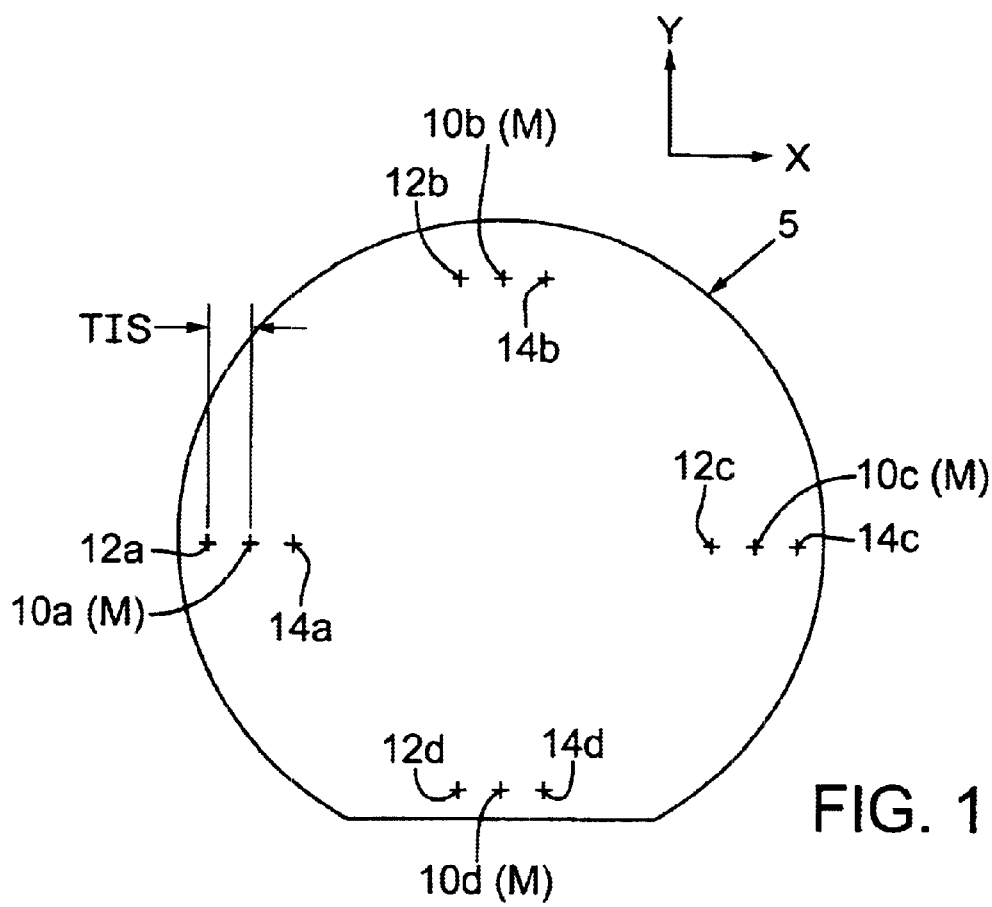
FIG. 1 is a plan view of a semiconductor wafer (as an exemplary lithographic substrate) including alignment marks.

Reference is made to FIG. 1, which is a plan view of an exemplary microlithography substrate or "wafer" 5 (e.g., silicon wafer). The wafer 5 has imprinted thereon one or more alignment marks M. Now, suppose that the alignment microscope of the microlithography apparatus (stepper) has a TIS in the alignment of its optical axis AA. In such an event, the respective "apparent" positions 12a–12d of the alignment marks M as detected by the alignment microscope in conjunction with the interferometers will not be coincident with their respective actual positions 10a–10d. Without a way in which to confirm whether the apparent positions 12a–12d are in fact the respective actual positions 10a–10d, the resulting TIS may go undetected and likely will proportionately degrade the overall accuracy of microlithographic exposure performed using the apparatus.

The several embodiments described below are directed to determining whether a TIS has occurred that could adversely affect the determined position of a mark on the wafer W, wafer chuck WC, wafer table WT, or analogous location.

First Representative Embodiment

Figure 2:
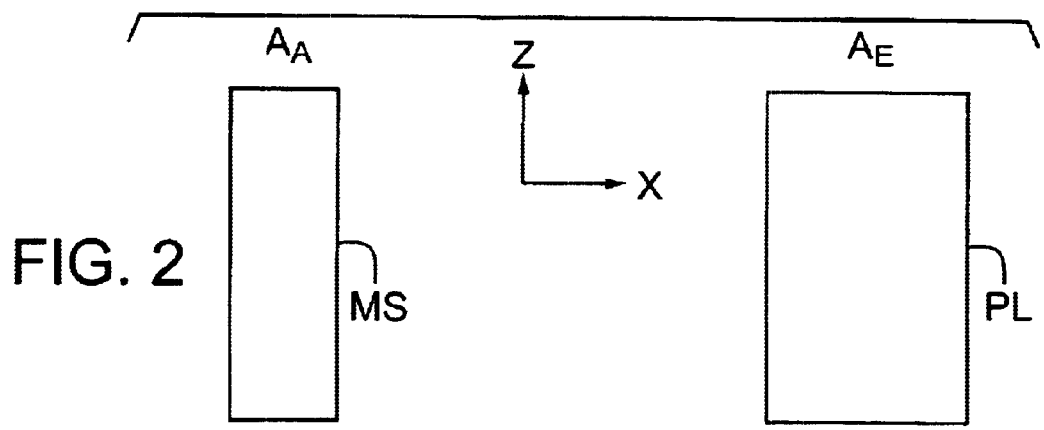
FIG. 2 is an elevational view of a microlithography apparatus in the vicinity of an alignment microscope and imaging system, showing two possible positions (alignment position and exposure position) of the wafer stage to which are mounted a rotary actuator, wafer table, and wafer chuck, as discussed in the first representative embodiment.
Figure 2:
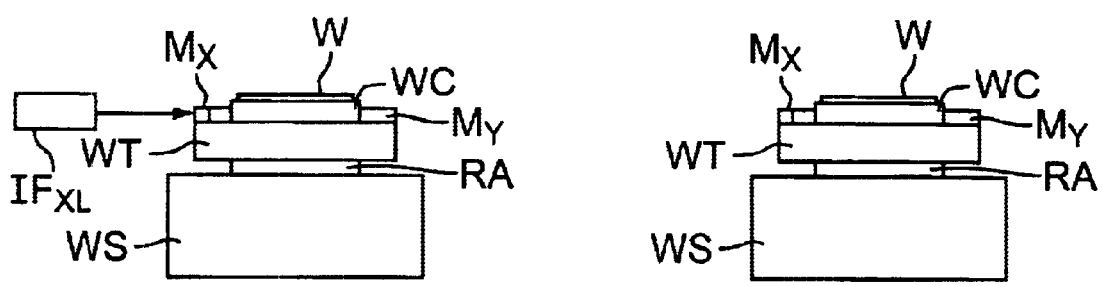

In this embodiment, shown in FIG. 2, the wafer table WT is provided with a rotary actuator RA situated between the wafer table WT and the wafer stage WS. The rotary actuator RA desirably is configured, when energized, to rotate the wafer table WT (with wafer chuck WC and wafer W) exactly 180° about an axis extending perpendicularly to the wafer chuck WC and wafer W. The rotational axis can be, for example, at the center of the region on the wafer chuck WC to which the wafer W is mounted.

The rotary actuator RA can have any suitable configuration such as, but not limited to, a gear-reduced electric motor, direct-drive electric motor, electric motor with a belt drive, or pneumatic actuator. The rotary actuator need not be positioned between the wafer table WT and wafer stage WS. For example, a rotational bearing can be provided between the wafer stage WS and the wafer table WT, and a rotary actuator mounted on a body that drives the rotation.

The microscope MS is any of various microscopes as used, for example, in a stepper machine for alignment purposes. The microscope MS normally is situated axially upstream of the wafer stage WS at the alignment position. The microscope MS is configured to produce respective images of alignment marks and other alignment features that may be present on the wafer W, wafer chuck WC, and/or wafer table WT. To such end, the microscope MS includes an illumination light source used to illuminate the subject mark or other alignment feature to be imaged. The illumination light entering the microscope normally is reflected from the subject mark or other alignment feature. For performing an alignment, the subject mark or other alignment feature is aligned with an alignment reference with the aid of the microscope. For example, the alignment reference can be the optical axis of the microscope MS, as indicated by an alignment reticle or analogous component in the microscope.

The imaging system PL can be configured as a projection-optical system (lithographic projection lens) of any of various types used in modern stepper machines. Alternatively, the imaging system PL can be configured for contact printing, for example. The imaging system PL can utilize electromagnetic radiation (e.g., ultraviolet light or X-rays) or a charged particle beam as a lithographic energy beam. If configured as a projection lens, the imaging system PL forms an image on the wafer W of a corresponding illuminated region on a reticle (not shown but well understood to be situated optically upstream of the imaging system). The subject region on the reticle is illuminated by an illumination system (not shown but well understood as situated optically upstream of the reticle).

Figure 3:
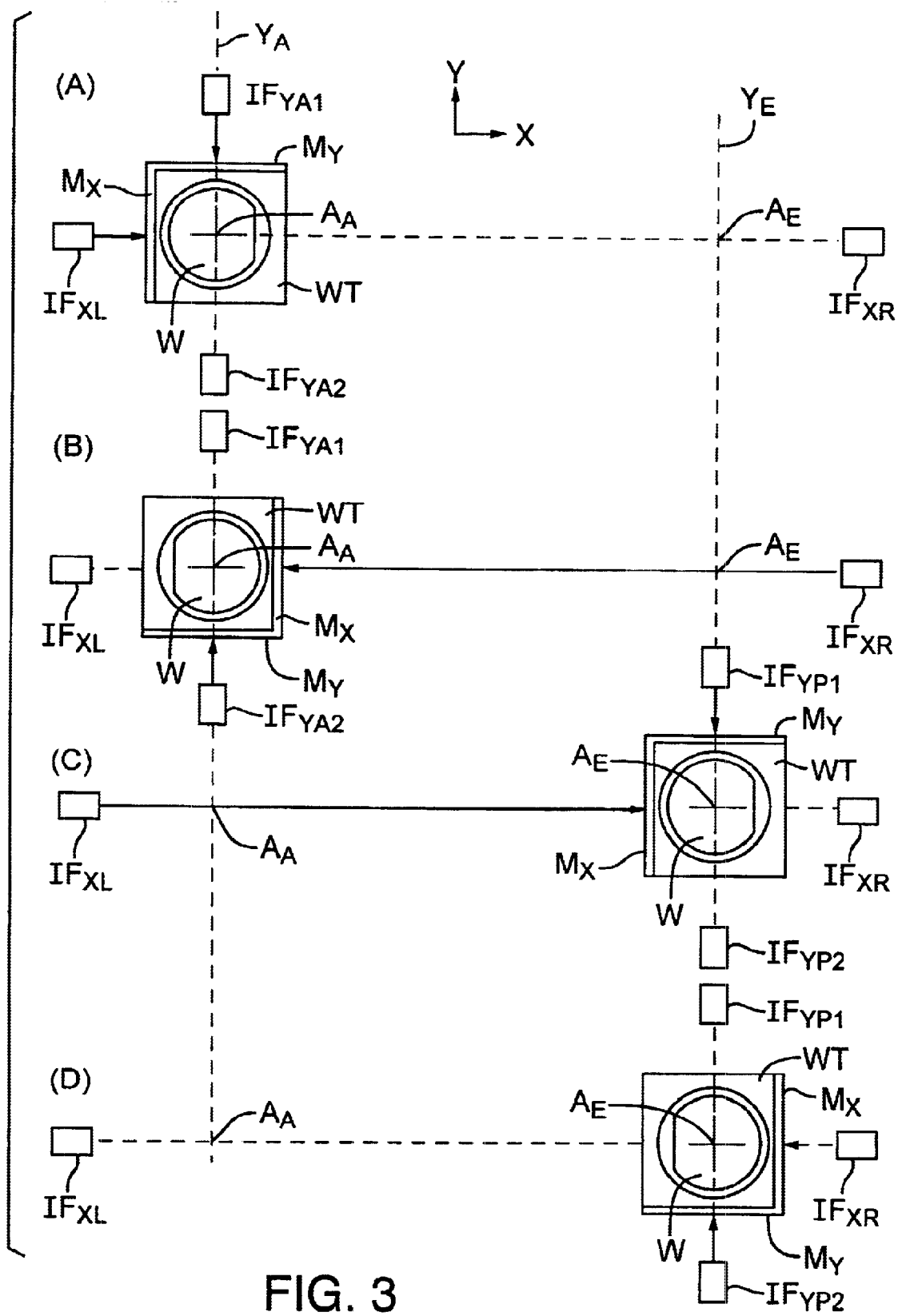
FIG. 3 is a schematic plan view showing the wafer table in either the alignment position or exposure position, at which positions the wafer table can be in a non-rotated condition (parts (A) and (C)) or a 180°-rotated condition (parts (B) and (D)), according to the first representative embodiment.
Figure 6:
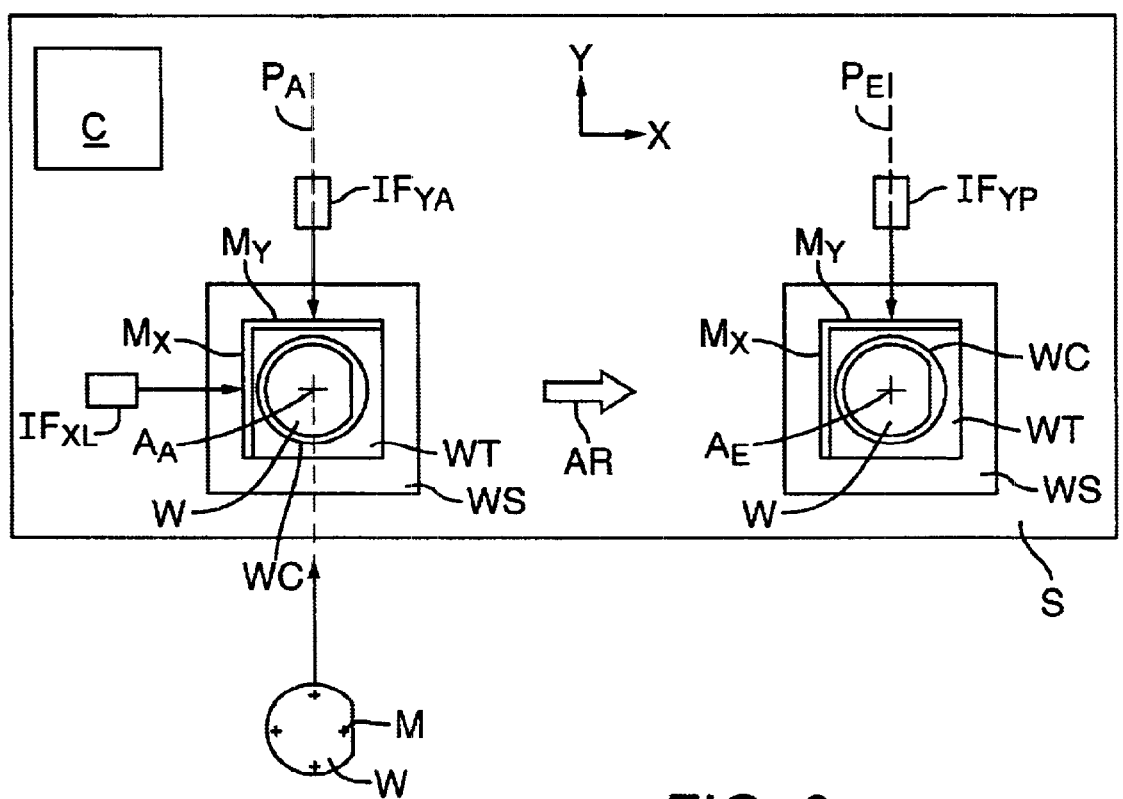
FIG. 6 is a plan view of a conventional microlithography apparatus in the vicinity of the alignment microscope and projection-optical system, showing two possible positions (alignment position and exposure position) of the wafer stage.

Reference now is made to FIG. 3, in which components that are similar to corresponding components shown in FIG. 2 have the same reference numerals. FIG. 3 shows interferometers $IF_{XL}$, $IF_{YA1}$, and $IF_{YP1}$ that are similar in placement and function as the respective interferometers $IF_{XL}$, $IF_{YA}$, $IF_{YP}$ in the conventional apparatus (FIG. 6). The embodiment of FIG. 3 also includes three additional interferometers $IF_{XR}$, $IF_{YA2}$, and $IF_{YP2}$. The interferometer $IF_{XR}$ is situated opposite the interferometer $IF_{XL}$, the interferometer $IF_{YA2}$ is situated opposite the interferometer $IF_{YA1}$, and the interferometer $IF_{YP2}$ is situated opposite the interferometer $IF_{YP1}$.

Although not shown in FIG. 3, it will be understood that the interferometers $IF_{XL}$, $IF_{XR}$, $IF_{YA1}$, $IF_{YA2}$, $IF_{YP1}$, $IF_{YP2}$ are each connected to a controller (see FIG. 6 and related discussion). The controller is configured to receive data from the interferometers and perform arithmetical calculations by which data from the interferometers are converted to data concerning the X-Y position (positional coordinates) of the wafer table WT. The controller also calculates, from the respective positional coordinates of the wafer table WT, corresponding positional coordinates of an "alignment feature" (e.g., alignment mark, discussed below) used for alignment-measurement purposes. The "controller" in this context can be the main controller of the stepper machine, which is connected to any of various other data-producing and data-responsive components of the stepper machine S, and coordinates and executes overall operation of the stepper machine S. Alternatively, the controller can be a separate entity from the main controller of the stepper machine S. In any event, general aspects of the use and operation of controllers are well known in the art.

In the uppermost portion (part (A)) of FIG. 3, the wafer table WT (mounted on the wafer stage WS, not shown) is situated at the alignment position in a normal orientation for detection of positional coordinates of the wafer table WT by the interferometers $IF_{XL}$ and $IF_{YA1}$. In the next portion (part (B)) of the figure, the wafer table WT is still at the alignment position, but has been rotated 180° from the position shown in part (A) by the rotary actuator RA. As shown in part (B) of FIG. 3, the positional coordinates of the wafer table WT cannot be determined using the interferometers $IF_{XL}$, $IF_{YA1}$. Instead, the interferometers $IF_{XR}$, $IF_{YA2}$ are used.

Returning to FIG. 1, representative alignment marks M (as representative alignment features) are shown. Although these alignment marks M are depicted as being situated on a wafer, it will be understood that some or all the marks M alternatively can be situated on the wafer chuck WC or wafer table WT, for example, or on any combination of appropriate surfaces that are rotated relative to the wafer stage WS. Suppose, at the wafer-table position indicated by part (A) of FIG. 3, the alignment marks M are detected to be at the apparent positions 12a–12d, respectively. According to this embodiment, to determine whether the detected positions 12a–12d are respective "actual" positions of the marks M, the wafer table WT is rotated 180° by the rotary actuator RA to the position shown in part (B) of FIG. 3. At this position, if the stepper machine S has a TIS, then the alignment marks M will exhibit respective detected positional shifts to the respective locations 14a–14d (FIG. 1). These shifts are interpreted by the controller of the stepper machine as an actual TIS (the controller can be configured to produce and route appropriate commands to other components of the stepper machine to take corrective action serving to compensate for the TIS). For example, if the amount of two-dimensional mis-registration (as detected by the alignment microscope) of the positions 12a–12d of the alignment marks M is $(\Delta X_1, \Delta Y_1)$ and the amount of two-dimensional mis-registration (as detected by the alignment microscope) of the positions 14a–14d of the alignment marks M is $(\Delta X_2, \Delta Y_2)$, then the TIS (Ta, Tb) is $((\Delta X_1+\Delta X_2)/2), ((\Delta Y_1+\Delta Y_2)/2)$. This amount is utilized as a compensating value to compensate for the detected position of the alignment mark M. In another example, the optical system of the alignment microscope may be adjusted in a manner such that (Ta, Tb) and the TIS fall within an allowable range.

If the detected respective positions of the alignment marks M do not shift during a change from the wafer-table position shown in part (A) of FIG. 3 to the wafer-table position shown in part (B) of FIG. 3, then the controller interprets this situation as an absence of any significant TIS detectable in this manner.

In part (C) of FIG. 3, the wafer table WT (mounted on the wafer stage WS, not shown) is shown shifted to the exposure position, with the wafer table WT in the same rotational orientation as shown in part (A) of FIG. 3. With the wafer table WT placed as shown in part (C), its positional coordinates can be detected using the interferometers $IF_{XL}$, $IF_{YP1}$ in the same manner as conventionally. In part (D) of FIG. 3, the wafer table WT is still at the exposure position, but the wafer table WT has been rotated 180° from the position in part (C) by the rotary actuator RA. As shown in part (D) of FIG. 3, the positional coordinates of the wafer table WT cannot be determined using the interferometers $IF_{XL}$, $IF_{YP1}$. Rather, the interferometers $IF_{XR}$, $IF_{YP2}$ are used. Note, however, that the Y-direction movable mirror My is still used, whenever the wafer table WT is rotated 180°, for obtaining positional data in the Y-direction; similarly, the X-direction movable mirror $M_X$ is still used for obtaining positional data in the X-direction.

Again, suppose that, at the wafer-table position indicated by part (C) of FIG. 3, the alignment marks M are detected to be at the apparent positions 12a–12d, respectively. According to this embodiment, to determine whether the detected positions 12a–12d are respective "actual" positions of the marks M, the wafer table WT is rotated 180° to the position shown in part (D) of FIG. 3. At this position, if the stepper machine S has acquired a TIS, then the alignment marks M will exhibit a detected positional shift to the respective locations 14a–14d. This shift is interpreted by the controller of the stepper machine as an actual TIS. If the detected respective positions of the alignment marks M do not shift during a change from the wafer-table position of part (C) of FIG. 3 to the wafer-table position of part (D) of FIG. 3, then the controller interprets this situation as an absence of any significant TIS detectable by this method.

Rotating the wafer table WT as shown in part (D) of FIG. 3 is optional. Normally, it is not necessary to have the wafer rotated at the exposure position. This would eliminate the need for the interferometer $IF_{YP2}$.

In this embodiment, the wafer table WT is not provided with any additional movable mirrors. Rather, using the same number and configuration of movable mirrors as conventionally, the X-Y position of the wafer table WT is determined before and after rotation of the wafer table by employing the additional interferometers $IF_{XR}$, $IF_{YA2}$, $IF_{YP2}$.

Although this embodiment is discussed in the context of rotating the wafer table WT 180°, this amount of rotation is not to be regarded as limiting. The wafer table WT can be configured generally to experience any appropriate degree of rotation relative to the wafer stage WS. For most purposes, appropriate degrees of rotation would be 90°, 180°, and 270°. Additional interferometers can be placed as required to provide the after-rotation positional data for the wafer table WT.

For simplicity, FIG. 3 depicts the wafer table WT centered on either the alignment axis $A_A$ or the exposure axis $A_E$. This is not to be construed as limiting in any way. At the alignment position, for example, the wafer stage WS can be actuated to place any locus (e.g., an alignment mark) on the wafer W on the alignment axis, and the rotary actuator can be actuated to achieve rotation while preserving such alignment. The same applies to the exposure position.

In addition, although this embodiment is described and illustrated in the context of detecting the respective X-Y coordinates of the wafer table WT at the alignment position and at the exposure position, this scheme is not to be regarded as limiting. Coordinates of the wafer table WT can be detected at either position or at any of various positions between the alignment position and the exposure position, or at any other position that can be reached by appropriate movement of the wafer stage WS.

Furthermore, although this embodiment is discussed in the context of rotating the wafer table WT (with wafer chuck WC) relative to the wafer stage WS, in alternative configurations the entire wafer stage can be rotated or the wafer chuck WC can be rotated relative to the wafer table WT. In the latter alternative configuration, the rotary actuator RA is situated between the wafer chuck WC and the wafer table WT. (In any event, rotation of the rotary actuator RA typically is controlled by the controller.) As is evident from the foregoing discussion, rotating the wafer table WT can require additional interferometers to provide positional data concerning the wafer table. Rotating the wafer chuck WC relative to the wafer table WT allows the same interferometers to be used in both the rotated and non-rotated condition. A disadvantage of rotating the wafer chuck relative to the wafer table include added parts and complexity to the wafer table, where space is very tight.

Hence, in general, rotation occurs relative to the optical systems (MS and PL). The assembly of rotatable components (e.g., one or more of the wafer table, wafer chuck, and components attached thereto) is termed herein the "rotatable member," and the rotary actuator RA is situated between the rotatable member and the wafer stage WS. For example, as noted above, the rotary actuator RA can be situated between the wafer chuck WC and the wafer table WT, wherein the wafer chuck (and any components attached thereto) is regarded as the rotatable member. Alternatively, as noted above, the rotary actuator RA can be situated between the wafer table WT and the wafer stage WS, wherein the assembly of the wafer table WT and wafer chuck WC (and any components attached thereto) is regarded as the rotatable member.

Second Representative Embodiment

Figure 4:
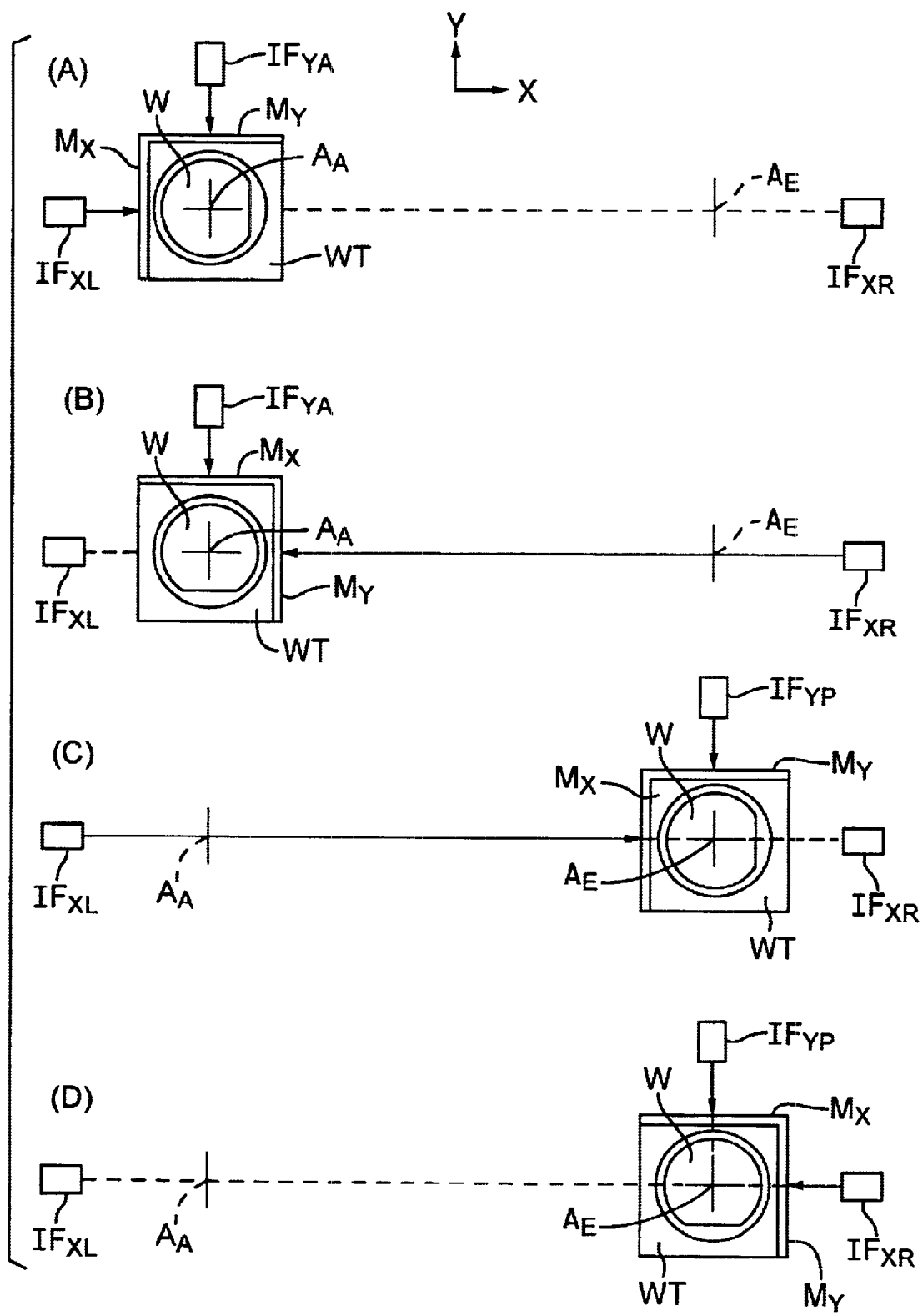
FIG. 4 is a schematic plan view showing the wafer table in either the alignment position or exposure position, at which positions the wafer table can be in a non-rotated condition (parts (A) and (C)) or a 90°-rotated condition (parts (B) and (D)), according to the second representative embodiment.

This embodiment is shown in FIG. 4, in which components that are similar to corresponding components discussed above have the same reference numerals. Referring back to FIG. 2, the wafer stage WS in this embodiment is provided with a rotary actuator RA desirably situated between the wafer table WT and the wafer stage WS. The rotary actuator RA can have any suitable configuration, as discussed in the first representative embodiment.

The embodiment of FIG. 4 includes the interferometers $IF_{XL}$, $IF_{YA}$, and $IF_{YP}$ that are similar in placement and function as the respective interferometers in a conventional apparatus (FIG. 6). The embodiment of FIG. 4 also includes one additional interferometer $IF_{XR}$ (rather than three additional interferometers as in the first representative embodiment). The interferometer $IF_{XR}$ is situated opposite the interferometer $IF_{XL}$. Employing fewer interferometers is advantageous because interferometers of the type used in stepper machines are very expensive.

Although not shown in FIG. 4, it will be understood that the interferometers $IF_{XL}$, $IF_{XR}$, $IF_{YA}$, $IF_{YP}$ are each connected to a controller, well known in the art (see FIG. 6), and as discussed above.

In the uppermost portion (part (A)) of FIG. 4, the wafer table WT (mounted on the wafer stage, not shown) is situated at the alignment position in a normal orientation for detection of the positional coordinates of the wafer table WT by the interferometers $IF_{XL}$ and $IF_{YA}$. In the next portion (part (B)) of the figure, the wafer table WT is still at the alignment position, but the wafer table WT has been rotated clockwise 90° from the position in part (A) by the rotary actuator RA. As shown in part (B) of FIG. 4, the positional coordinates of the wafer table WT cannot be determined using the pair of interferometers $IF_{XL}$, $IF_{YA}$. Instead, the pair $IF_{XR}$, $IF_{YA}$ is used. Note that, in the 90°-shifted position, the X-direction position of the wafer table WT is detected using the Y-direction movable mirror $M_Y$, and the Y-direction position of the wafer table WT is detected using the X-direction movable mirror $M_X$.

In part (C) of FIG. 4, the wafer table WT is shown shifted to the exposure position, with the wafer table WT in the same rotational orientation as shown in part (A) of FIG. 4. With the wafer table WT placed as shown in part (C), its positional coordinates can be detected using the interferometers $IF_{XL}$, $IF_{YP}$ in the same manner as conventionally. In part (D) of FIG. 4, the wafer table WT is still at the exposure position, but the wafer table WT has been rotated clockwise 90° from the position in part (C) by the rotary actuator RA. As shown in part (D) of FIG. 4, the positional coordinates of the wafer table WT cannot be determined using the pair of interferometers $IF_{XL}$, $IF_{YP}$. Instead, the pair $IF_{XR}$, $IF_{YP}$ is used. Note also that, in the 90'-shifted position, the X-direction position of the wafer table WT is detected using the Y-direction movable mirror $M_Y$, and the Y-direction position of the wafer table WT is detected using the X-direction movable mirror $M_X$.

Rotating the wafer table WT as shown in part (D) of FIG. 4 is optional. As noted above, it normally is not necessary to have the wafer rotated at the exposure position.

This embodiment is not as useful as the first representative embodiment for normal checking of the positions of alignment marks. This is because a 180° rotation provides more definitive data for such purposes than a 90° rotation. However, there certainly are instances in which an alignment check based on a 90° rotation is useful, such as performing an orthogonality check of the movable mirrors $M_X$, $M_Y$.

In this embodiment, as in the first representative embodiment, the wafer table WT is not provided with any additional movable mirrors. Rather, using the same number and configuration of movable mirrors as conventionally, the X-Y position of the wafer table WT is determined before and after rotation of the wafer table by employing the additional interferometer $IF_{XR}$.

Although this embodiment is discussed in the context of rotating the wafer table WT (with wafer chuck WC) 90°, this degree of rotation is not to be regarded as limiting. The wafer table WT can be configured generally to experience any appropriate degree of rotation relative to the wafer stage WS. Additional interferometers can be placed as required to provide the after-rotation positional data for the wafer table WT.

For simplicity, FIG. 4 depicts the wafer table WT centered on either the alignment axis $A_A$ or the exposure axis $A_E$. This is not to be construed as limiting in any way. At the alignment position, for example, the wafer stage WS can be actuated to place any locus (e.g., an alignment mark) on the wafer W on the alignment axis, and the rotary actuator can be actuated to achieve rotation while preserving such alignment. The same applies to the exposure position.

In addition, although this embodiment is described in the context of detecting the respective X-Y coordinates of the wafer table WT at the alignment position and at the exposure position, this scheme is not to be regarded as limiting. Coordinates of the wafer table WT can be detected at either position or at any of various positions between the alignment position and the exposure position, or at any other position that can be reached by appropriate movement of the wafer stage WS.

Furthermore, although this embodiment is discussed in the context of rotating the wafer table WT (with wafer chuck WC) relative to the wafer stage WS, in an alternative configuration the wafer chuck WC is rotated relative to the wafer table WT. In this alternative configuration, the rotary actuator RA is situated between the wafer chuck WC and the wafer table WT.

Third Representative Embodiment

Figure 5:
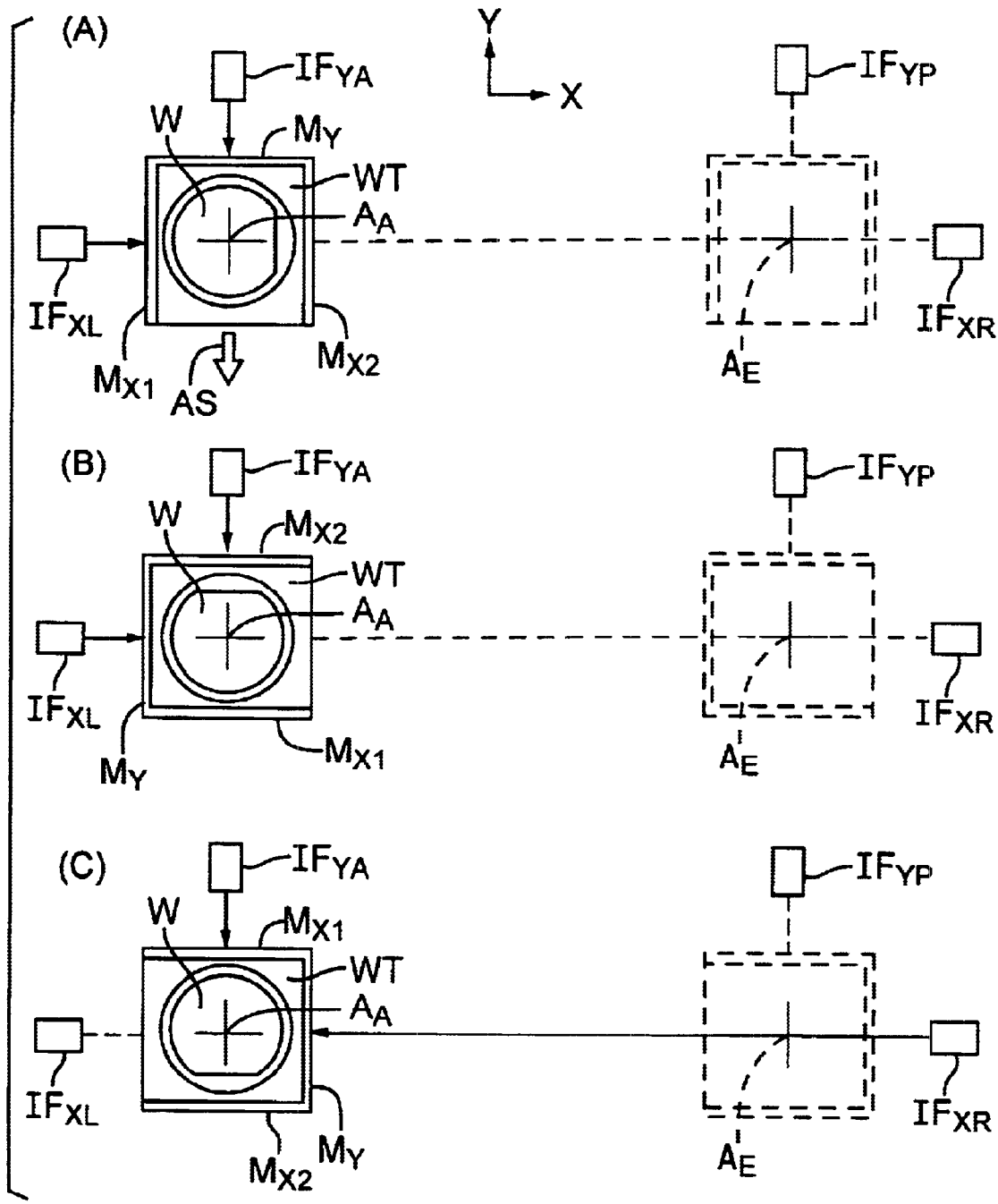
FIG. 5 is a schematic plan view showing the wafer table in either the alignment position (solid lines) or exposure position (dashed lines), at which positions the wafer table can be in a non-rotated condition (part (A)), a −90°-rotated condition (part (B)), or a +90°-rotated condition (part (C)), according to the third representative embodiment.

This embodiment is shown in FIG. 5, in which components that are similar to corresponding components discussed above have the same reference numerals. Referring back to FIG. 2, the wafer stage WS in this embodiment is provided with a rotary actuator RA desirably situated between the wafer table WT and the wafer stage WS. The rotary actuator RA can have any suitable configuration, as discussed above in the first representative embodiment.

The embodiment of FIG. 5 includes the interferometers $IF_{XL}$, $IF_{YA}$, and $IF_{YP}$ that are similar in placement and function as the respective interferometers in a conventional apparatus (FIG. 6). The embodiment of FIG. 5 also can include an additional interferometer $IF_{XR}$. The interferometer $IF_{XR}$ is situated opposite the interferometer $IF_{XL}$.

Although not shown in FIG. 5, it will be understood that the interferometers $IF_{XL}$, $IF_{XR}$, $IF_{YA}$, $IF_{YP}$ are each connected to a controller, well known in the art (see FIG. 6), and as discussed above.

This embodiment differs from the first and second representative embodiments in that, in this embodiment, the wafer table WT comprises three, rather than two, movable mirrors. In the uppermost portion (part (A)) of FIG. 5, the movable mirrors are denoted $M_{X1}$, $M_{X2}$, and $M_Y$. Use of the additional movable mirror $M_{X2}$ in this embodiment allows both 90° and 180° rotational checks to be performed while having to provide only one additional interferometer, compared to a conventional apparatus.

In the uppermost portion (part (A)) of FIG. 5, the wafer table WT (mounted on the wafer stage, not shown) is situated at the alignment position in a normal orientation for detection of the positional coordinates of the wafer table WT by the interferometers $IF_{XL}$ and $IF_{YA}$. Also, in this position, the parallel aspect of the movable mirrors $M_{X1}$, $M_{X2}$ can be checked by moving the wafer stage in the Y-direction, as indicated by the arrow AS. The movement desirably is over a distance sufficient to encompass the full length of the movable mirrors $M_{X1}$, $M_{X2}$. During such movement, the interferometers $IF_{XL}$ and $IF_{XR}$ are used to check the movable mirrors $M_{X1}$, $M_{X2}$, respectively. In the middle portion (part (B)) of the figure, the wafer table WT is still at the alignment position, but the wafer table WT has been rotated counterclockwise 90°, by the rotary actuator RA, from the position in part (A). As shown in part (B) of FIG. 5, the positional coordinates of the wafer table WT still can be determined using the pair of interferometers $IF_{XL}$, $IF_{YA}$. With the wafer table WT in this 90°-rotated position, the X-direction position of the wafer table WT is detected using the Y-direction movable mirror $M_Y$, and the Y-direction position of the wafer table WT is detected using the X-direction movable mirror $M_{X2}$.

In part (C) of FIG. 5, the wafer table WT is still situated at the alignment position, but the wafer table WT has been rotated 180° from the position shown in part (B). In part (C), the positional coordinates of the wafer table WT in the X-Y plane are determined using the pair of interferometers $IF_{YA}$, $IF_{XR}$ and the movable mirrors $M_{X1}$, $M_Y$, respectively.

FIG. 5 also indicates that measurements of the positional coordinates of the wafer table WT, at rotational positions similar to those shown in solid lines in parts (A), (B), and (C) of FIG. 5, also can be performed with the wafer table WT at the exposure position (dashed lines). In part (A), the X-Y position of the wafer table WT can be determined using any of the pairs of interferometers ($IF_{YP}$, $IF_{XR}$) or ($IF_{YP}$, $IF_{XL}$). In part (B), the X-Y position of the wafer table WT is determined using the pair of interferometers $IF_{YP}$, $IF_{XL}$. In part (C), the X-Y position of the wafer table WT is determined using the pairs of interferometers $IF_{YP}$, $IF_{XR}$. It is noted that, in parts (B) and (C) of FIG. 5, rotating the wafer table WT at the exposure position is optional. As noted above, it normally is not necessary to have the wafer rotated at the exposure position.

In this embodiment, rotation of the wafer table WT can be limited to 90° as shown in the left-hand portions of parts (A) and (B) of the figure. No additional interferometers would be required.

Although this embodiment is discussed in the context of rotating the wafer table WT 90°, this degree of rotation is not to be regarded as limiting. The wafer table WT can be configured generally to experience any appropriate degree of rotation relative to the wafer stage WS. Additional interferometers can be placed as required to provide the after-rotation positional data for the wafer table WT.

For simplicity, FIG. 5 depicts the wafer table WT centered on either the alignment axis $A_A$ or the exposure axis $A_E$. This is not to be construed as limiting in any way. At the alignment position, for example, the wafer stage WS can be actuated to place any locus (e.g., an alignment mark) on the wafer W on the alignment axis, and the rotary actuator can be actuated to achieve rotation while preserving such alignment. The same applies to the exposure position.

In addition, although this embodiment is described in the context of detecting the respective X-Y coordinates of the wafer table WT at the alignment position and at the exposure position, this scheme is not to be regarded as limiting. Coordinates of the wafer table WT can be detected at either position or at any of various positions between the alignment position and the exposure position, or at any other position that can be reached by appropriate movement of the wafer stage WS.

Furthermore, although this embodiment is discussed in the context of rotating the wafer table WT (with wafer chuck WC) relative to the wafer stage WS, in an alternative configuration the wafer chuck WC is rotated relative to the wafer table WT. In this alternative configuration, the rotary actuator RA is situated between the wafer chuck WC and the wafer table WT.

Fourth Representative Embodiment

Figure 7:
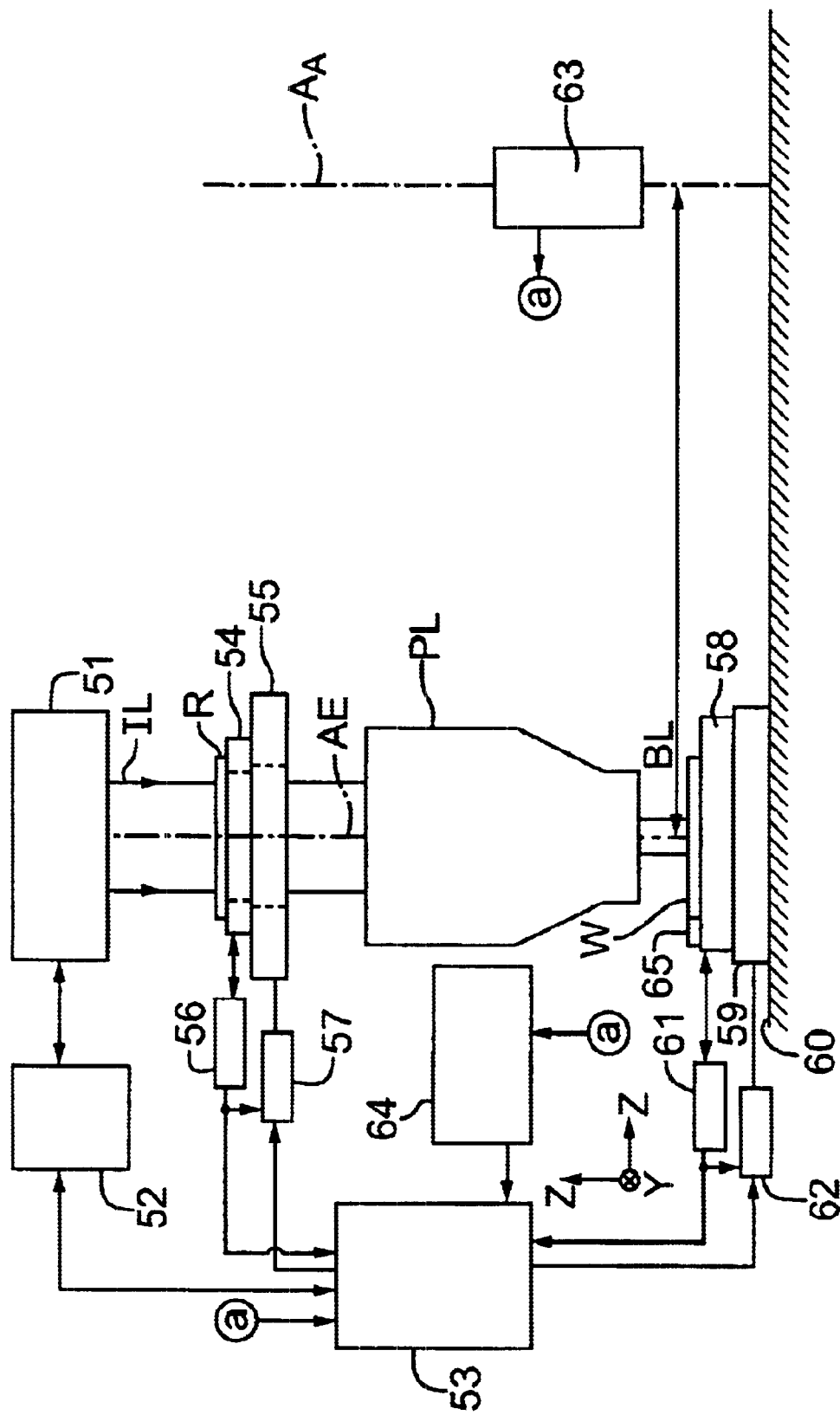
FIG. 7 is a schematic elevational diagram of a microlithography apparatus as described in the fourth representative embodiment.

A projection aligner ("stepper" or, in general, "microlithography apparatus") with which any of the foregoing embodiments can be used is depicted in FIG. 7. Many of the components and their interrelationships in this apparatus are known in the art, and hence are not described in detail herein.

For exposure an illumination "light" IL is produced and directed by an illumination-optical system 51 to irradiate a selected region of a reticle R. The illumination-optical system 51 typically comprises an exposure-light source (e.g., ultraviolet light source, extreme ultraviolet light source, charged-particle-beam source), an integrator, a variable field stop, and a condenser lens system or the like. An image of the irradiated portion of the reticle R is projected by a projection-optical system PL onto a corresponding region of a wafer W or other suitable substrate. So as to be imprinted with the image, the upstream-facing surface of the wafer W is coated with a suitable resist. The projection-optical system PL has a projection magnification $\beta$ ($\beta = \frac{1}{5}$ or $\frac{1}{4}$, for example). An exposure controller 52 is connected to the illumination-optical system 51 and operates to optimize the exposure dose on the wafer W, based on control data produced and routed to the exposure controller 52 by a main control system 53.

In the system depicted in FIG. 7, the Z-axis extends parallel to an optical axis $A_E$ of the projection-optical system PL, the X-axis extends laterally across the plane of the page perpendicularly to the Z-axis, and the Y-axis extends perpendicularly to the plane of the page. The reticle R is mounted on a reticle stage 54, which is operable to position the reticle R relative to a reticle base 55 in the X- and Y-axis directions. The reticle stage 54 also is operable to rotate the reticle R as required about the Z-axis, based on control data routed to the reticle stage 54 by a reticle-stage driver 57 connected to the reticle stage 54. The control data produced by the reticle-stage driver 57 is based upon reticle-stage coordinates as measured by a laser interferometer 56.

The wafer W is mounted to a wafer holder such as a wafer chuck (not detailed), which in turn is mounted to a wafer table 58. The wafer table 58 is mounted to a wafer stage 59 configured to move the wafer table 58 (with wafer chuck) in the X- and Y-axis directions relative to a base 60 on an air bearing. The wafer table 58 is operable to move the wafer chuck and wafer W in the Z-axis direction (focusing direction) relative to the projection-optical system PL. The wafer table 58 also is operable, as part of an auto-focus system (not detailed) to tilt the wafer W relative to the optical axis AE so as to properly place the wafer surface for imaging by the projection-optical system PL. The wafer stage 59 is operable to move the wafer table 58 in a stepping manner in the X- and Y-axis directions, as controlled by a wafer-stage driver 62 connected to the wafer stage 59. The wafer-stage driver 62 receives data concerning the X-Y position of the wafer table 58 as measured by a laser interferometer 61. Exposure of individual shot areas on the wafer W is achieved by performing a respective stepping motion of the wafer stage 59 followed by exposure of an image of the pattern on the reticle R in a step-and-repeat manner.

Typical fabrication processes for microelectronic devices and displays involve multiple microlithography steps of respective patterns onto the wafer in a superposed manner. After exposing a pattern of a particular layer onto the wafer surface, and at time of exposing a pattern of a subsequent layer, alignment of the reticle R and wafer W should be performed before exposing the subsequent layer. For such a purpose, a reference-mark member 65, defining one or more reference marks, is provided on the wafer table 58. The reticle R is aligned with the reference-mark member 65, based upon alignment measurements obtained using a reticle-alignment microscope (not shown). An alignment sensor 63 (desirably an image-processing type) is situated adjacent the projection-optical system PL and has an axis $A_A$ that is parallel to the axis $A_E$. The alignment sensor 63 desirably comprises an image-pickup device (not detailed) that produces an image signal that is routed to an alignment-signal processor 64. The alignment-signal processor 64 determines respective alignment positions of alignment marks on the wafer W relative to corresponding index marks. The image-processing performance of the alignment-signal processor 64 is disclosed in, for example, U.S. Pat. No. 5,493,403, incorporated herein by reference.

Turning now to FIG. 8(A), a two-dimensional alignment mark 38 is shown on the wafer surface. At least one alignment mark 38 is situated in each shot area 36 on the wafer W, and comprises a mark portion 37X with elements arrayed at a given pitch in the X-axis direction, and a mark portion 37Y with elements arrayed at a given pitch in the Y-axis direction. In each mark portion 37X, 37Y, the constituent elements can be defined by recessed and protruding features relative to the wafer surface. Alternatively or in addition, alignment marks on the wafer can be configured as one-dimensional marks 40X, 40Y, as shown in FIG. 8(B). Each mark 40X, 40Y has constituent elements arrayed at a given pitch in the X- and Y-axis directions, respectively. In each mark 40X, 40Y, the constituent elements can be defined by recessed and protruding features relative to the wafer surface.

Returning to FIG. 7, an exemplary structure of the reference-mark member 65 and its use for alignment purposes and the like are disclosed in U.S. Pat. No. 5,243,195, incorporated herein by reference.

The apparatus shown in FIG. 7 can be any of various types of microlithography apparatus. For example, as an alternative to operating in a "step-and-repeat" manner characteristic of steppers, the apparatus can be a scanning-type microlithography apparatus operable to expose the pattern from the reticle R to the wafer W while continuously scanning both the reticle R and wafer W in a synchronous manner. During such scanning, the reticle R and wafer W are moved synchronously in opposite directions perpendicular to the optical axis $A_E$. The scanning motions are performed by the respective stages 54, 59.

In contrast, a step-and-repeat microlithography apparatus performs exposure only while the reticle R and wafer W are stationary. If the microlithography apparatus is an "optical lithography" apparatus, the wafer W typically is in a constant position relative to the reticle R and projection-optical system PL during exposure of a given pattern field. After the particular pattern field is exposed, the wafer W is moved, perpendicularly to the optical axis $A_E$ and relative to the reticle R, to place the next field of the wafer W into position for exposure. In such a manner, images of the reticle pattern are sequentially exposed onto respective fields on the wafer W.

Pattern-exposure apparatus as provided herein are not limited to microlithography apparatus for manufacturing microelectronic devices. As a first alternative, for example, the apparatus can be a liquid-crystal-device (LCD) microlithography apparatus used for exposing a pattern for a liquid-crystal display onto a glass plate. As a second alternative, the apparatus can be a microlithography apparatus used for manufacturing thin-film magnetic heads. As a third alternative, the apparatus can be a proximity-microlithography apparatus used for exposing, for example, a mask pattern. In this alternative, the mask and substrate are placed in close proximity with each other, and exposure is performed without having to use a projection-optical system PL.

The principles of the invention as described above further alternatively can be used with any of various other apparatus, including (but not limited to) other microelectronic-processing apparatus, machine tools, metal-cutting equipment, and inspection apparatus.

In any of various microlithography apparatus as described above, the source (in the illumination-optical system 51) of illumination "light" can be, for example, a g-line source (438 nm), an i-line source (365 nm), a KrF excimer laser (248 nm), an ArF excimer laser (193 nm), or an $F_2$ excimer laser (157 nm). Alternatively, the source can be of a charged particle beam such as an electron or ion beam, or a source of X-rays (including "extreme ultraviolet" radiation). If the source produces an electron beam, then the source can be a thermionic-emission type (e.g., lanthanum hexaboride or $LaB_6$ or tantalum (Ta)) of electron gun. If the illumination "light" is an electron beam, the pattern can be transferred to the wafer W from the reticle R or directly to the wafer W without using a reticle.

With respect to the projection-optical system PL, if the illumination light comprises far-ultraviolet radiation, the constituent lenses are made of UV-transmissive materials such as quartz and fluorite that readily transmit ultraviolet radiation. If the illumination light is produced by an $F_2$ excimer laser or EUV source, then the lenses of the projection-optical system PL can be either refractive or catadioptric, and the reticle R desirably is a reflective type. If the illumination "light" is an electron beam (as a representative charged particle beam), then the projection-optical system PL typically comprises various charged-particle-beam optics such as electron lenses and deflectors, and the optical path should be in a suitable vacuum. If the illumination light is in the vacuum ultraviolet (VUV) range (less than 200 nm), then the projection-optical system PL can have a catadioptric configuration with beam splitter and concave mirror, as disclosed for example in U.S. Pat. Nos. 5,668,672 and 5,835,275, incorporated herein by reference. The projection-optical system PL also can have a reflecting-refracting configuration including a concave mirror but not a beam splitter, as disclosed in U.S. Pat. Nos. 5,689,377 and U.S. patent application Ser. No. 08/873,606, filed on Jun. 12, 1997, incorporated herein by reference.

Either or both the reticle stage 54 and wafer stage 59 can include respective linear motors for achieving the motions of the reticle R and wafer W, respectively, in the X-axis and Y-axis directions. The linear motors can be air-levitation types (employing air bearings) or magnetic-levitation types (employing bearings based on the Lorentz force or a reactance force). Either or both stages 54, 59 can be configured to move along a respective guide or alternatively can be guideless. See U.S. Pat. Nos. 5,623,853 and 5,528,118, incorporated herein by reference.

Further alternatively, either or both stages 54, 59 can be driven by a planar motor that drives the respective stage by electromagnetic force generated by a magnet unit having two-dimensionally arranged magnets and an armature-coil unit having two-dimensionally arranged coils in facing positions. With such a drive system, either the magnet unit or the armature-coil unit is connected to the respective stage and the other unit is mounted on a moving-plane side of the respective stage.

Movement of a stage 54, 59 as described herein can generate reaction forces that can affect the performance of the microlithography apparatus. Reaction forces generated by motion of the wafer stage 59 can be shunted to the floor (ground) using a frame member as described, e.g., in U.S. Pat. No. 5,528,118, incorporated herein by reference. Reaction forces generated by motion of the reticle stage 54 can be shunted to the floor (ground) using a frame member as described in U.S. Pat. No. 5,874,820, incorporated herein by reference.

A microlithography apparatus such as any of the various types described above can be constructed by assembling together the various subsystems, including any of the elements listed in the appended claims, in a manner ensuring that the prescribed mechanical accuracy, electrical accuracy, and optical accuracy are obtained and maintained. For example, to maintain the various accuracy specifications, before and after assembly, optical system components and assemblies are adjusted as required to achieve maximal optical accuracy. Similarly, mechanical and electrical systems are adjusted as required to achieve maximal respective accuracies. Assembling the various subsystems into a microlithography apparatus requires the making of mechanical interfaces, electrical-circuit wiring connections, and pneumatic plumbing connections as required between the various subsystems. Typically, constituent subsystems are assembled prior to assembling the subsystems into a microlithography apparatus. After assembly of the apparatus, system adjustments are made as required to achieve overall system specifications in accuracy, etc. Assembly at the subsystem and system levels desirably is performed in a clean room where temperature and humidity are controlled.

Fifth Representative Embodiment

Any of various microelectronic devices and displays can be fabricated using an apparatus as described in the fourth representative embodiment. An exemplary process is depicted in FIG. 9. In step 301, the function and performance characteristics of the subject device are designed. Next, in step 302, a mask (reticle) defining a corresponding pattern is designed according to the specifications established in the preceding step. In a parallel step 303 to step 302, a wafer or other suitable substrate is made. In step 304 the mask pattern designed in step 302 is exposed onto the wafer using a microlithography apparatus as described herein. In step 305 the microelectronic device is assembled; this typically includes dicing, bonding, and packaging steps as well known in the art. Finally, in step 306, the devices are inspected.

Figure 10:
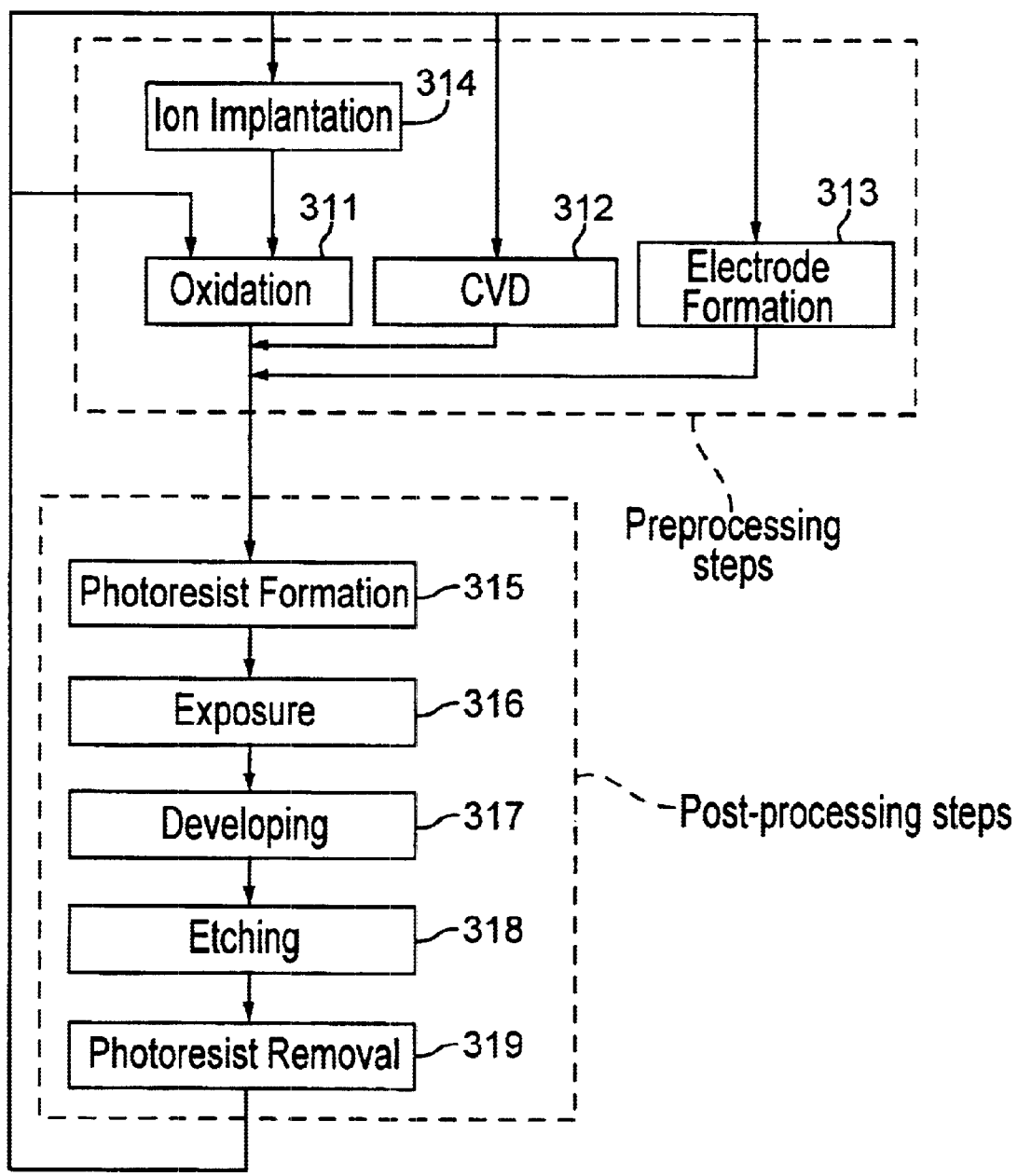
FIG. 10 is a flow chart of certain details of the microlithography exposure step in the process of FIG. 9.

FIG. 10 is a flow chart of details of step 304, as applied to manufacturing microelectronic devices. In step 311 (oxidation) the surface of the wafer is oxidized. In step 312 ("CVD" or chemical vapor deposition) an insulating film is formed on the wafer surface. In step 313 (electrode formation) electrodes are formed on the wafer by vapor deposition. In step 314 (ion implantation) ions are implanted in the wafer. These steps 311–314 constitute the "pre-process" steps for wafers during wafer processing; during these steps selections are made as required according to processing requirements.

Continuing further with FIG. 10, at each stage of wafer processing, after the above-mentioned pre-process steps are completed, the following "post-process" steps are executed. Initially, in step 315 (photoresist formation), a layer of a suitable resist is applied to the wafer surface. Next, in step 316 (exposure), the microlithography apparatus is used to transfer the circuit pattern defined by the mask (reticle) to the wafer. In step 317 (developing) the exposed layer of resist on the wafer surface is developed. In step 318 (etching), portions of the wafer surface not protected by residual resist are removed by etching. In step 319 (photoresist removal) any resist remaining after completing the etching step is removed.

Multiple circuit patterns are formed on the wafer surface by repeating these pre-process and post-process steps as required.

Whereas the invention has been described in connection with multiple representative embodiments, it will be understood that the invention is not limited to those embodiments. On the contrary, the invention is intended to encompass all alternatives, modifications, and equivalents as may be included within the spirit and scope of the invention, as defined by the appended claims.

What is claimed is:

1. In a microlithography method performed using a microlithography apparatus including a wafer stage and a holding member configured to hold a substrate relative to the wafer stage, a method for measuring a tool-induced shift, comprising:
    (a) providing the holding member with rotatability in increments of 90°, relative to the wafer stage, from a first rotational position to a second rotational position;
    (b) at the first rotational position, determining a respective location of an alignment feature on the holding member;
    (c) rotating the holding member about a rotational axis to the second rotational position;
    (d) at the second rotational position, determining a respective location of the alignment feature; and
    (e) comparing the respective location of the alignment feature determined at the first rotational position with the respective location of the alignment feature at the second rotational position and determining a corresponding tool-induced shift from a detected difference between the respective locations.

2. The method of claim 1, wherein the holding member comprises a wafer table and a wafer chuck to which the substrate is mounted.

3. The method of claim 1, wherein:
    the holding member comprises a wafer chuck to which the substrate is mounted; and
    a wafer table is situated between the wafer stage and the wafer chuck.

4. The method of claim 1, wherein step (a) comprises providing a rotary actuator configured to rotate the holding member relative to the wafer stage about the rotational axis from the first rotational position to the second rotational position.

5. The method of claim 1, wherein step (a) comprises providing the holding member with rotatability in increments of 180°, relative to the wafer stage, from the first rotational position to the second rotational position.

6. The method of claim 1, wherein:
    the wafer stage is movable back and forth between an alignment position and an exposure position; and
    in steps (b) and (d) the respective determinations are performed at the alignment position.

7. The method of claim 1, wherein:
    the wafer stage is movable back and forth between an alignment position and an exposure position; and
    in steps (b) and (d) the respective determinations are performed at the alignment position and at the exposure position.

8. The method of claim 1, wherein steps (b) and (d) each comprise imaging the alignment feature using a microscope.

9. The method of claim 8, wherein steps (b) and (d) each further comprise interferometrically determining coordinates of the alignment feature in an X-Y plane perpendicular to an optical axis of an imaging system.

10. A method for operating an exposure apparatus, comprising the method of claim 1 for measuring a tool-induced shift.

11. A method for making an object, comprising a microlithography process that includes the method of claim 10 for operating an exposure apparatus.

12. A method for processing a wafer, comprising the method of claim 10 for operating an exposure apparatus.

13. In a microlithography method performed using a microlithography apparatus including a wafer stage, a wafer table, and a wafer chuck configured to hold a substrate, a method for measuring a tool-induced shift, comprising:

(a) providing a rotary actuator situated and configured to rotate the wafer table and wafer chuck relative to the wafer stage about a rotational axis from a first rotational position to a second rotational position;

(b) providing an alignment feature on at least one of the wafer table, wafer chuck, and substrate held by the wafer chuck;

(c) at the first rotational position, aligning the alignment feature with an alignment reference, and determining a respective positional coordinate of the wafer table;

(d) at the second rotational position, aligning the alignment feature with the alignment reference and determining a respective positional coordinate of the wafer table; and (e) comparing the respective coordinate determined at the first rotational position with the respective coordinate determined at the second rotational position, and determining a corresponding tool-induced shift from a detected difference between the respective coordinates.

14. The method of claim 13, wherein in steps (c) and (d) the respective alignments are performed using a microscope.

15. The method of claim 13, wherein in steps (c) and (d) the respective positional coordinates are determined using respective interferometers.

16. The method of claim 13, wherein in step (a) the first and second rotational positions are 180° relative to each other.

17. The method of claim 13, wherein in step (a) the first and second rotational positions are 90° relative to each other.

18. In a microlithography apparatus including a holding member and a wafer stage, a device for measuring a tool-induced shift, the device comprising:

a rotary actuator situated and configured to rotate the holding member relative to the wafer stage from a first rotational position to a second rotational position;

an alignment-measurement device situated and configured to align an alignment feature, carried by the holding member, with an alignment reference;

at least one respective interferometer situated and configured to obtain data on positional coordinates of the holding member at each of the first and second rotational positions as the alignment feature is aligned with the alignment reference, the holding member including a reflective member situated and configured to cooperate with the at least one respective interferometer; and a controller, connected to the rotary actuator and the interferometers, configured to determine from the positional coordinates at each of the first and second rotational positions of the holding member, a tool-induced shift.

19. The apparatus of claim 18, wherein the alignment measurement device comprises an alignment microscope.

20. The apparatus of claim 18, wherein the holding member comprises a wafer table and a wafer chuck mounted to the wafer table.

21. The apparatus of claim 20, wherein:

the wafer table comprises an X-direction movable mirror and a Y-direction movable mirror; and the apparatus further comprises respective interferometers for each of the X-direction movable mirror and Y-direction movable mirror at each of the first and second rotational positions.

22. The apparatus of claim 21, wherein the wafer table comprises three movable mirrors.

23. The apparatus of claim 18, wherein the wafer stage is movable back and forth between an alignment position and an exposure position.

24. The apparatus of claim 23, wherein the at least one respective interferometer is configured to produce data on the positional coordinates of the holding member at the alignment position.

25. The apparatus of claim 23, wherein the at least one respective interferometer is configured to produce data on the positional coordinates of the holding member at both the alignment and exposure positions.

26. The apparatus of claim 18, wherein the rotary actuator is configured to rotate the holding member 180° relative to the wafer stage from the first rotational position to the second rotational position.

27. The apparatus of claim 18, wherein the rotary actuator is configured to rotate the holding member 90° relative to the wafer stage from the first rotational position to the second rotational position.

28. An exposure apparatus, comprising the device for measuring a tool-induced shift as recited in claim 18.

29. An object manufactured using the exposure apparatus of claim 28.

30. A substrate on which an image has been formed using the exposure apparatus of claim 28.

31. A microlithography apparatus, comprising:

an imaging system;

a wafer stage situated optically downstream of the imaging system;

a wafer table situated relative to the wafer stage and configured to hold a lithographic substrate for exposure by the imaging system; and a device for measuring a tool-induced shift, the device comprising (a) a rotary actuator situated and configured to rotate the wafer table relative to the wafer stage about a rotational axis from a first rotational position to a second rotational position; (b) an alignment microscope situated and configured to align an alignment feature, carried by the wafer table, with an alignment reference; (c) at least one respective interferometer situated and configured to obtain data on positional coordinates of the wafer table at each of the first and second rotational positions as the alignment feature is aligned with the alignment reference; and (d) a controller, connected to the rotary actuator and the interferometers, configured to determine from the positional coordinates at each of the first and second rotational positions of the wafer table, a tool-induced shift.

32. A microlithography apparatus, comprising;

an imaging system;

a wafer stage situated optically downstream of the imaging system;

a holding member situated relative to the wafer stage and configured to hold a lithographic substrate for exposure by the imaging system; and a device for measuring a tool-induced shift, comprising (a) a rotary actuator situated and configured to rotate the holding member relative to the wafer stage from a first rotational position to a second rotational position; (b) an alignment-measurement device situated and configured to align an alignment feature, carried by the holding member, with an alignment reference; (c) at least one respective interferometer situated and configured to obtain data on positional coordinates of the holding member at each of the first and second rotational positions as the alignment feature is aligned with the alignment reference, wherein the holding member includes a reflective member situated and configured to cooperate with the at least one respective interferometer; and (d) a controller, connected to the rotary actuator and the interferometers, configured to determine from the positional coordinates at each of the first and second rotational positions of the holding member, a tool-induced shift.

33. In a microlithography apparatus including a wafer table and a wafer stage, a device for measuring a tool-induced shift, the device comprising:

a rotary actuator situated and configured to rotate the wafer table relative to the wafer stage about a rotational axis from a first rotational position to a second rotational position;

an alignment microscope situated and configured to align an alignment feature, carried by the wafer table, with an alignment reference;

at least one respective interferometer situated and configured to obtain data on positional coordinates of the wafer table at each of the first and second rotational positions as the alignment feature is aligned with the alignment reference; and a controller, connected to the rotary actuator and the interferometers, configured to determine from the positional coordinates at each of the first and second rotational positions of the wafer table, a tool-induced shift.

34. The apparatus of claim 33, further comprising a wafer chuck mounted to the wafer table.

35. The apparatus of claim 34, wherein the alignment feature comprises an alignment mark located on at least one of the wafer table, wafer chuck, and substrate held by the wafer chuck.

36. The apparatus of claim 34, wherein the wafer table comprises at least two movable mirrors including an X-direction movable mirror and a Y-direction movable mirror.

37. The apparatus of claim 36, further comprising a respective interferometer for each of the movable mirrors at each of the first and second rotational positions.

38. The apparatus of claim 33, wherein the wafer stage is movable back and forth between an alignment position and an exposure position.

* * * * *

UNITED STATES PATENT AND TRADEMARK OFFICE
CERTIFICATE OF CORRECTION

PATENT NO. : 6,678,038 B2  
DATED : January 13, 2004  
INVENTOR(S) : Micheal Binnard It is certified that error appears in the above-identified patent and that said Letters Patent is hereby corrected as shown below:

Column 11,  
Line 24, "90'-shifted" should read -- 90º-shifted --.

Signed and Sealed this

Twenty-fourth Day of May, 2005

JON W. DUDAS  
*Director of the United States Patent and Trademark Office*